United States Patent
O'Donnell et al.

(10) Patent No.: US 6,537,429 B2
(45) Date of Patent: Mar. 25, 2003

(54) DIAMOND COATINGS ON REACTOR WALL AND METHOD OF MANUFACTURING THEREOF

(75) Inventors: Robert J. O'Donnell, Alameda, CA (US); John E. Daugherty, Alameda, CA (US); Christopher C. Chang, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 28 days.

(21) Appl. No.: 09/749,925

(22) Filed: Dec. 29, 2000

(65) Prior Publication Data

US 2002/0086501 A1 Jul. 4, 2002

(51) Int. Cl.$^7$ .................. C23C 14/00; B32B 9/00; H05K 3/00

(52) U.S. Cl. ............ 204/193; 204/192.1; 204/192.11; 204/192.15; 204/192.25; 204/196.37; 204/298.01; 427/577; 428/332; 428/408; 428/698; 428/704

(58) Field of Search ..................... 428/408, 332, 428/698, 704; 204/193, 192.1, 192.11, 192.15, 192.25, 196.37, 298.01; 427/577

(56) References Cited

U.S. PATENT DOCUMENTS

| | | | |
|---|---|---|---|
| 4,340,462 A | 7/1982 | Koch | 204/289 |
| 4,491,496 A | 1/1985 | Laporte et al. | 156/345 |
| 4,534,816 A | 8/1985 | Chen et al. | 156/345 |
| 4,612,077 A | 9/1986 | Tracy et al. | 156/345 |
| 4,948,458 A | 8/1990 | Ogle | 156/643 |
| 5,006,200 A | 4/1991 | Chen | 156/629 |
| 5,022,979 A | 6/1991 | Hijikata et al. | 204/298.33 |
| 5,200,232 A | 4/1993 | Tappan et al. | 427/569 |
| 5,262,029 A | 11/1993 | Erskine et al. | 204/298.15 |
| 5,268,200 A * | 12/1993 | Steger | |
| 5,308,661 A | 5/1994 | Feng et al. | 427/535 |
| 5,366,585 A | 11/1994 | Robertson et al. | 156/643 |
| 5,393,572 A | 2/1995 | Dearnaley | 427/523 |
| 5,494,713 A | 2/1996 | Ootuki | 427/579 |
| 5,522,932 A | 6/1996 | Wong et al. | 118/715 |
| 5,569,356 A | 10/1996 | Lenz et al. | 156/643.1 |
| 5,641,375 A | 6/1997 | Nitescu et al. | 156/345 |
| 5,680,013 A | 10/1997 | Dornfest et al. | 315/111.21 |
| 5,798,016 A | 8/1998 | Oehrlein et al. | 156/345 |
| 5,812,362 A | 9/1998 | Ravi | 361/234 |
| 5,820,723 A | 10/1998 | Benjamin et al. | 156/345 |
| 5,824,605 A | 10/1998 | Chen et al. | 438/729 |
| 5,838,529 A | 11/1998 | Shufflebotham et al. | 361/234 |
| 5,846,613 A | 12/1998 | Neuville | 427/575 |
| 5,863,376 A | 1/1999 | Wicker et al. | 156/345 |
| 5,879,523 A | 3/1999 | Wang et al. | 204/298.11 |
| 5,885,356 A | 3/1999 | Zhao et al. | 118/723 |
| 5,888,907 A | 3/1999 | Tomoyasu et al. | 438/714 |
| 5,891,253 A | 4/1999 | Wong et al. | 118/726 |
| 5,895,586 A | 4/1999 | Kaji et al. | 219/121.43 |
| 5,904,778 A | 5/1999 | Lu et al. | 118/723 |
| 5,916,370 A | 6/1999 | Chang | |
| 5,952,060 A | 9/1999 | Ravi | 427/577 |
| 5,989,511 A | 11/1999 | Gruen et al. | 423/446 |
| 6,015,597 A | 1/2000 | David | 427/577 |
| 6,048,798 A | 4/2000 | Gadgil et al. | 438/714 |
| 6,071,828 A * | 6/2000 | Mihara | |

FOREIGN PATENT DOCUMENTS

| | | |
|---|---|---|
| DE | 4300223 A1 | 7/1994 |
| JP | 62-103379 | 5/1987 |
| WO | WO91/17562 A | 11/1991 |
| WO | WO01/13404 A | 2/2001 |

OTHER PUBLICATIONS

Written Opinion for PCT/US01/43153 dated Aug. 6, 2002.
Notification of Transmittal of the International Search Report or the Declaration dated Apr. 29, 2002.

* cited by examiner

Primary Examiner—Archene Turner
(74) Attorney, Agent, or Firm—Burns, Doane, Swecker & Mathis, LLP

(57) ABSTRACT

A corrosion resistant component of semiconductor processing equipment such as a plasma chamber includes a diamond containing surface and process for manufacture thereof.

31 Claims, 1 Drawing Sheet

DIAMOND COATINGS ON REACTOR WALL AND METHOD OF MANUFACTURING THEREOF

BACKGROUND OF THE INVENTION

1. Field of the Invention

The present invention relates to semiconductor processing equipment and a method of improving corrosion resistance of such components.

2. Description of the Related Art

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

During processing of semiconductor substrates, the substrates are typically held in place within the vacuum chamber by substrate holders such as mechanical clamps and electrostatic clamps (ESC). Examples of such clamping systems and components thereof can be found in commonly owned U.S. Pat. Nos. 5,262,029 and 5,838,529. Process gas can be supplied to the chamber in various ways such as by gas nozzles, gas rings, gas distribution plates, etc. An example of a temperature controlled gas distribution plate for an inductively coupled plasma reactor and components thereof can be found in commonly owned U.S. Pat. No. 5,863,376. In addition to the plasma chamber equipment, other equipment used in processing semiconductor substrates include transport mechanisms, gas supply systems, liners, lift mechanisms, load locks, door mechanisms, robotic arms, fasteners, and the like. The components of such equipment are subject to a variety of corrosive conditions associated with semiconductor processing. Further, in view of the high purity requirements for processing semiconductor substrates such as silicon wafers and dielectric materials such as the glass substrates used for flat panel displays, components having improved corrosion resistance are highly desirable in such environments.

Aluminum and aluminum alloys are commonly used for walls, electrodes, substrate supports, fasteners and other components of plasma reactors. In order to prevent corrosion of the such metal components, various techniques have been proposed for coating the aluminum surface with various coatings. For instance, U.S. Pat. No. 5,641,375 discloses that aluminum chamber walls have been anodized to reduce plasma erosion and wear of the walls. The '375 patent states that eventually the anodized layer is sputtered or etched off and the chamber must be replaced. U.S. Pat. No. 5,895,586 states that a technique for forming an erosion resistant film of $Al_2O_3$, AlC, TiN, TiC, AlN or the like on aluminum material can be found in Japanese Application Laid-Open No. 62-103379.

U.S. Pat. No. 5,680,013 states that a technique for flame spraying $Al_2O_3$ on metal surfaces of an etching chamber is disclosed in U.S. Pat. No. 4,491,496. The '013 patent states that the differences in thermal expansion coefficients between aluminum and ceramic coatings such as aluminum oxide leads to cracking of the coatings due to thermal cycling and eventual failure of the coatings in corrosive environments. In order to protect the chamber walls, U.S. Pat. Nos. 5,366,585; 5,798,016; and 5,885,356 propose liner arrangements. For instance, the '016 patent discloses a liner of ceramics, aluminum, steel and/or quartz with aluminum being preferred for its ease of machinability and having a coating of aluminum oxide, $SC_2O_3$ or $Y_2O_3$, with $Al_2O_3$ being preferred for coating aluminum to provide protection of the aluminum from plasma. The '585 patent discloses a free standing ceramic liner having a thickness of at least 0.005 inches and machined from solid alumina. The '585 patent also mentions use of ceramic layers which are deposited without consuming the underlying aluminum can be provided by flame sprayed or plasma sprayed aluminum oxide. The '356 patent discloses a ceramic liner of alumina and a ceramic shield of aluminum nitride for the wafer pedestal. U.S. Pat. No. 5,885,356 discloses ceramic liner materials for use in CVD chambers.

Various coatings have been proposed for metal components of semiconductor processing equipment. For instance, U.S. Pat. No. 5,879,523 discloses a sputtering chamber wherein a thermally sprayed coating of $Al_2O_3$ is applied to a metal such as stainless steel or aluminum with an optional $NiAl_x$ bond coating therebetween. U.S. Pat. Nos. 5,522,932 and 5,891,53 disclose a rhodium coating for metal components of an apparatus used for plasma processing of substrates with an optional nickel coating therebetween. U.S. Pat. No. 5,680,013 discloses non-bonded ceramic protection for metal surfaces in a plasma processing chamber, the preferred ceramic material being sintered AlN with less preferred materials including aluminum oxide, magnesium fluoride, and magnesium oxide. U.S. Pat. No. 5,904,778 discloses a SiC CVD coating on free standing SiC for use as a chamber wall, chamber roof, or collar around the wafer.

With regard to plasma reactor components such as showerhead gas distribution systems, various proposals have been made with respect to the materials of the showerheads. For instance, commonly owned U.S. Pat. No. 5,569,356 discloses a showerhead of silicon, graphite, or silicon carbide. U.S. Pat. No. 5,494,713 discloses forming an alumite film on an aluminum electrode and a silicon coating film such as silicon oxide or silicon nitride over the alumite film. The '713 patent states that the thickness of the silicon coating film should be 10 $\mu$m or less, preferably about 5 $\mu$m, since the aluminum coating film, the alumite coating film and the silicon coating film have different coefficients of linear expansion and cracks are easily generated when the thickness of the silicon coating film is too thick. A thickness below 5 $\mu$m, however, is stated to be unfavorable since the protection of the aluminum substrate is insufficient. U.S. Pat. No. 4,534,516 discloses an upper showerhead electrode of stainless steel, aluminum, copper or the like. U.S. Pat. No. 4,612,077 discloses a showerhead electrode of magnesium. U.S. Pat. No. 5,888,907 discloses a showerhead electrode of amorphous carbon, SiC or Al. U.S. Pat. Nos. 5,006,220 and 5,022,979 disclose a showerhead electrode either made entirely of SiC or a base of carbon coated with SiC deposited by CVD to provide a surface layer of highly pure SiC.

U.S. Pat. No. 5,952,060 describes the use of carbon-based coatings to protect the interior chamber of substrate processing systems. The carbon-based coatings are diamond or diamond-like carbon coatings having a thickness between about 1 $\mu$m and 50 $\mu$m. U.S. Pat. No. 5,812,362 describes the use of diamond films on electrostatic chucks wherein the diamond films have a thickness of between 5 and 50 μm. Each of these patents disclose the selective use of extremely thin diamond and diamond-like coatings.

Other patents, such as U.S. Pat. Nos. 5,308,661; 5,393,572; 5,846,613; 5,989,511 and 6,015,597 also disclose diamond or diamond-like coatings. None of these patents describe the use of such coatings in a plasma reactor.

In view of the need for high purity and corrosion resistance for components of semiconductor processing equipment, there is a need in the art for improvements in materials and/or coatings used for such components. Moreover, with regard to the chamber materials, any materials which can increase the service life of a plasma reactor chamber and thus reduce the down time of the apparatus, would be beneficial in reducing the cost of processing the semiconductor wafers.

SUMMARY OF THE INVENTION

According to a first aspect of the invention a process for providing an erosion resistant diamond or diamond-like containing coating on a surface of a semiconductor processing equipment component is provided. The process includes depositing a diamond or diamond-like containing coating on a surface of a processing equipment component so as to form an outer erosion resistant surface. By erosion resistant surface, it is meant a surface coating that protects underlying materials from the corrosive effects of plasma chamber gases, while resisting erosion of the coating by the plasma chamber gases. The underlying surface of the process equipment component to be coated can comprise a metal, ceramic or polymer material with a preferable material being anodized aluminum.

In a preferred embodiment, one or more intermediate metal, ceramic or polymer coatings may be used between the surface of the semiconductor processing equipment and the diamond or diamond-like containing coating. Metal surfaces that may be coated include anodized or unanodized aluminum, stainless steel, a refractory metal such as molybdenum or other metal or alloy used in plasma chambers. Ceramic surfaces that may be coated include alumina, SiC, AlN, $Si_3N_4$, BC or other plasma compatible ceramic material. Polymeric surfaces that may be coated include fluoropolymers such as Teflon®, polyimides such as Vespel ®, and other polymeric materials useful in a plasma chamber at temperatures up to 200° C.

According to a second aspect of the invention, a metal component is provided. The component includes: (a) a metal surface; (b) an optional first intermediate coating on the metal surface; (c) an optional second intermediate coating on the first intermediate coating or on the metal surface; and a diamond or diamond-like containing coating on said component which provides a corrosion resistant outer surface. Each of the first and second intermediate coatings may be a metal or alloy thereof, ceramic, polymer or mixture or composite of materials used in plasma chamber reactors.

According to another aspect of the invention, there is provided a semiconductor processing equipment component made of a diamond or diamond-like containing material. The component may include any one or more coatings employed in such equipment.

BRIEF DESCRIPTION OF THE DRAWINGS

The objects and advantages of the invention will become apparent from the following detailed description of the preferred embodiments thereof in connection with the accompanying drawing, in which.

DETAILED DESCRIPTION OF THE PREFERRED EMBODIMENTS OF THE INVENTION

The invention provides an effective way to provide corrosion resistance to metal, ceramic and polymer surfaces of components of semiconductor processing apparatus such as parts of a plasma processing reactor chamber by utilizing an erosion resistant coating. Such components include chamber walls, substrate supports, gas distribution systems including showerheads, baffles, rings, nozzles, etc., fasteners, heating elements, plasma screens, liners, transport module components, such as robotic arms, fasteners, inner and outer chamber walls, etc., and the like.

Although the invention is applicable to any type of component having a metal, ceramic or polymer surface, for ease of illustration, the invention will be described in more detail with reference to the apparatus described in U.S. Pat. No. 5,820,723 which is incorporated herein by reference in its entirety.

Figure 1:
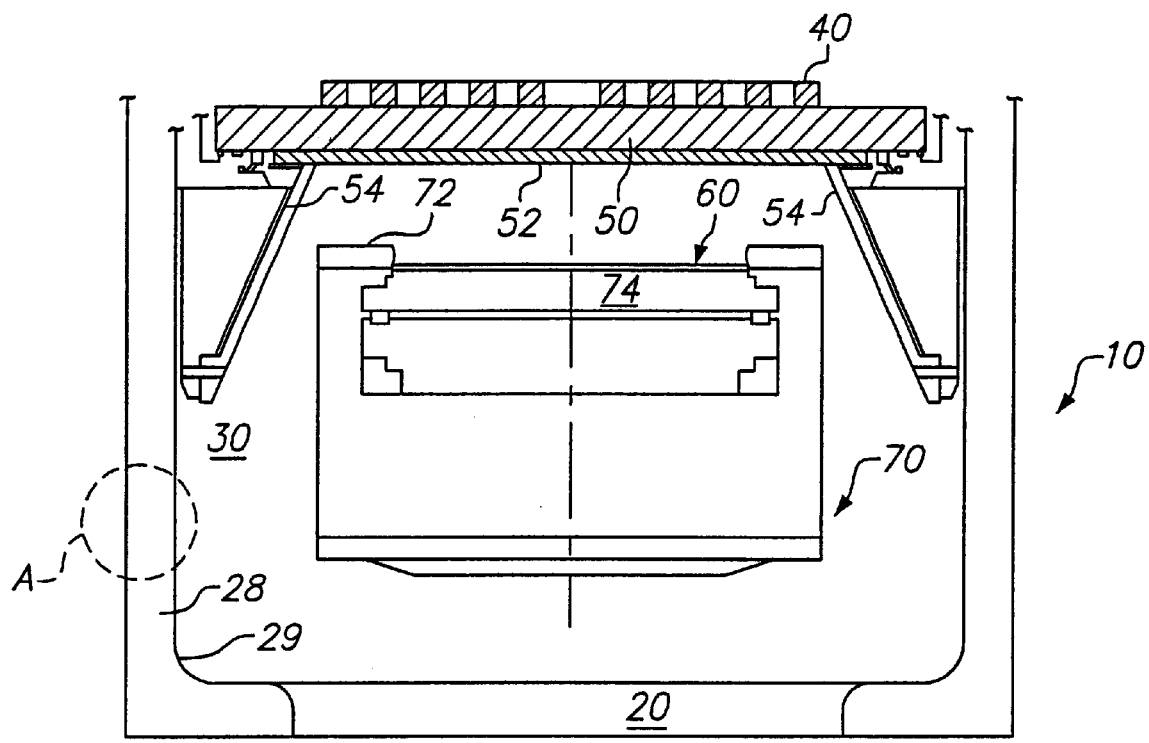
FIG. 1 is a schematic cross-sectional view of a plasma reactor chamber having a component coated with a corrosion resistant coating in accordance with the present invention.

FIG. 1 illustrates a vacuum processing reactor chamber 10 that includes a substrate holder 70 providing an electrostatic clamping force to a substrate 60 as well as providing an RF bias to the substrate while it is He backcooled. A focus ring 72 confines plasma in an area above the substrate. A source of energy for maintaining a high density (e.g., $10^{11}$–$10^{12}$ ions/cm$^3$) plasma in the chamber such as an antenna 40 powered by a suitable RF source to provide a high density plasma is disposed at the top of reactor chamber 10. The chamber includes suitable vacuum pumping apparatus for maintaining the interior 30 of the chamber at a desired pressure (e.g., below 50 mTorr, typically 1–20 mTorr) by evacuating the chamber through the centrally located vacuum port 20 at the bottom of the chamber.

A substantially planar dielectric window 50 of uniform thickness provided between the antenna 40 and the interior of the processing chamber 10 forms the vacuum wall at the top of the processing chamber 10. A gas distribution plate 52 is provided beneath window 20 and includes openings such as circular holes for delivering process gas from a gas supply to the chamber 10. A conical liner 54 extends from the gas distribution plate and surrounds the substrate holder 70.

In operation, a semiconductor substrate such as a silicon wafer 60 is positioned on the substrate holder 70 and is typically held in place by an electrostatic clamp 74 while He backcooling is employed. Process gas is then supplied to the vacuum processing chamber 10 by passing the process gas through a gap between the window 50 and the gas distribution plate 52. Suitable gas distribution plate arrangements (i.e., showerhead) are disclosed in commonly owned U.S. Pat. Nos. 5,824,605; 6,048,798; and 5,863,376, the disclosures of which are hereby incorporated by reference. For instance, while the window and gas distribution plate arrangement in FIG. 1 are planar and of uniform thickness, non-planar and/or non-uniform thickness geometries can be used for the window and/or gas distribution plate. A high density plasma is ignited in the space between the substrate and the window by supplying suitable RF power to the antenna 40.

Figure 2:
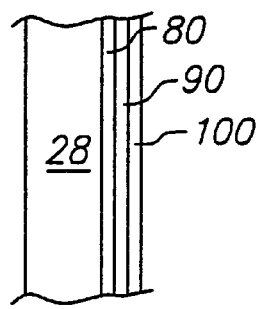
FIG. 2 shows details of the corrosion resistant coating in detail A of FIG. 1.

Chamber walls 28 such as anodized or unanodized aluminum walls and metal, ceramic or polymer components such as the substrate holder 70, fasteners 56, liners 54, etc., that are exposed to plasma and show signs of corrosion are candidates for coating according to the invention, thus avoiding the need to mask them during operation of the plasma chamber. Examples of metals and/or alloys that may be coated include anodized or unanodized aluminum and alloys thereof, stainless steel, refractory metals such as W and Mo and alloys thereof, copper and alloys thereof, etc. Examples of ceramic surfaces that may be coated include alumina, SiC, AlN, $Si_3N_4$, BC and $TiO_2$. Examples of commercially available polymer materials that may be coated include fluoropolymers such as Teflon ®, polyimides such as Vespel®, and other polymeric materials useful in a plasma chamber at temperatures up to 200° C. In a preferred embodiment, the component to be coated is a chamber wall 28 having an anodized or unanodized aluminum surface 29. The coating according to the invention permits use of aluminum alloys without regard as to its composition (thus allowing use of more economical aluminum alloys in addition to highly pure aluminum), grain structure or surface conditions. In the following discussion, an example of a component to be coated is an aluminum chamber wall 28 having a first optional intermediate coating 80, a second optional intermediate coating 90 and a diamond containing coating 100, as illustrated in FIG. 2.

In order to ensure good adhesion of the coated material, the surface of the aluminum substrate 28 is preferably thoroughly cleaned to remove surface material such as oxides or grease prior to coating. In addition, it is particularly desirable to roughen the substrate surface, anodize the substrate surface and again roughen the anodized substrate surface prior to application of any of the desired coatings.

According to the invention, a first intermediate coating 80 is optionally coated on the aluminum sidewall 28 by a conventional technique. The optional first intermediate coating 80 is sufficiently thick to adhere to the substrate and to further allow it to be processed prior to forming the optional second intermediate coating 90 or the diamond containing coating described below. The first intermediate coating 80 can have any suitable thickness such as a thickness of at least about 0.001 inches, preferably from about 0.001 to about 0.25 inches, more preferably between 0.001 and 0.1 inches and most preferably from 0.001 inches to 0.05 inches.

After depositing the optional first intermediate coating 80 onto aluminum substrate 28, the plating can be blasted or roughened by any suitable technique, and then overcoated with the second optional coating 90 or the diamond containing coating 100. A roughened layer 80 provides a particularly good bond. Desirably, the second intermediate coating 90 imparts a high mechanical compression strength to the coating 80 and minimizes formation of fissures in the coating 90.

The optional second intermediate coating 90 is sufficiently thick to adhere to the first intermediate coating 80 and to further allow it to be processed prior to forming any additional intermediate coatings or the outer diamond or diamond-like containing coating 100 described below. The second intermediate coating 90 can have any suitable thickness such as a thickness of at least about 0.001 inches, preferably from about 0.001 to about 0.25 inches, more preferably between 0.001 and 0.1 inches and most preferably between 0.001 inches and 0.05 inches.

The first and second intermediate coating may be made of any one or more materials employed in conventional plasma processing chambers. Examples of such materials include metals, ceramics and polymers. Particularly desirable metals include any one or more refractory metals, composites or alloys containing such metals. Particularly desirable ceramics include $Al_2O_3$, SiC, $Si_3N_4$, BC, AlN, $TiO_2$, etc. Particularly desirable polymers include fluoropolymers such as Teflon®, polyimides such as Vespel®, and other polymeric materials useful in a plasma chamber at temperatures up to 200° C. Specific materials contemplated for the intermediate layers also include fullerene containing materials; other hard carbon containing materials such as diamond and diamond-like materials; carbides, borides, nitrides and/or carbonitrides of, for example, hafnium, tantalum, titanium and/or silicon; boron carbides; boron nitrides; boron carbonitrides; zirconia; yttria or mixtures of any of the above-mentioned materials.

It is contemplated that the first and second intermediate layers 80 and 90, which are optional may be any one of the above-mentioned materials such that the coatings are the same or different depending on the desired properties. It is also anticipated that additional intermediate coatings such as a third, fourth or fifth intermediate coating of the same or different materials may be employed.

The diamond containing coating 100 is deposited on the optional second intermediate coating 90, or on the optional first intermediate coating 80, or on the aluminum substrate 28. The thickness of the diamond containing coating is desirably at least 0.001 inches; preferably from about 0.001 to about 0.25 inches, more preferably from about 0.001 to about 0.1 inches and most preferably from 0.001 to 0.05 inches. Most desirably, the diamond or diamond-like coatings are of a thickness useful to provide erosion and/or corrosion protection to the underlying layers, and particularly the substrate, for a significant period of exposure to the corrosive chamber gases. More desirably, the coatings are all equal to or greater than 0.001 inches, and most desirably between about 0.002 and 0.010 inches thick. The thickness of the diamond or diamond-like containing coating 100 can be selected to be compatible with the plasma environment to be encountered in the reactor (e.g., etching, CVD, etc.). This layer of diamond containing coating may be coated on all or part of the reactor chamber and components as discussed above.

By diamond containing coating, it is herein meant a coating containing diamond or diamond-like materials. Diamond-like materials are carbon-based materials having many but not all of the properties of diamond. These materials include amorphous carbon, hard carbon and α-carbon. Preferred diamond-like materials are noncrystalline carbon materials having a hardness of over 50% of diamond's hardness, preferably over 70% of diamond's hardness. All such coatings, meaning diamond or diamond-like, are collectively referred to hereinafter as diamond containing coatings.

In view of the desired thickness, it is most desirable to use diamond containing coatings which are doped or mixed with other protective materials such that the diamond containing coatings are composites of the diamond or diamond-like material and the other protective material. Such materials may include any one or more materials employed in conventional plasma processing chambers. Examples of such materials include any one or more metals, ceramics and polymers. Particularly desirable metals include any one or more refractory metals, composites or alloys containing such metals. Particularly desirable ceramics include $Al_2O_3$, SiC, $Si_3N_4$, BC, AlN, $TiO_2$, etc. Particularly desirable polymers include fluoropolymers such as Teflon®, polyimides such as Vespel® and other polymeric materials useful in a plasma chamber at temperatures up to 200° C. It is believed that the most desirable materials would include a diamond or diamond-like material alone or in combination with carbides, borides, nitrides and/or carbonitrides of, for example, hafnium, tantalum, titanium and/or silicon; boron carbides; boron nitrides; boron carbonitride; zirconia; yttria or mixtures of the above-mentioned materials.

As mentioned above, the diamond containing coating of the present invention may be doped with the other protective material. Doping concentrations of the other protective material are desirably less than or equal to one percent by weight of the diamond coating, more desirably between about 100 parts per million and one percent by weight of the diamond coating, and even more desirably between about 0.001 and 0.1 percent by weight of the diamond coating.

The diamond containing coating of the present invention may also be a composite with the other protective material. The composites desirably have a continuous matrix phase of the diamond containing coating. Composite concentrations of the other protective material are desirably greater than one percent by weight of the coating 100, more desirably between about 20 and 80 percent of the coating and even more desirably between about 40 and 60 percent of the coating. In some instances, particularly where cost is of significant importance, the percentage of diamond or diamond-like coating is very low, e.g., below 20, 10, 5 and one percent by weight of the coating.

The diamond containing coating of the present invention may be deposited onto the desired surface by any known coating technique such as thermal spraying, plasma spraying, chemical vapor deposition, sublimation, laser vaporization, sputtering, sputter deposition, ion beam coating, spray coating, dip coating, evaporation, roll-on coating brush coating, etc. It is contemplated that one or multiple diamond containing coatings with or without intermediate layers of other materials may be deposited onto the desired surface using such known techniques.

In an alternative aspect of the invention, there is provided a semiconductor processing equipment component made of a diamond containing material. The component may include any one or more coatings conventionally employed in such equipment.

By use of the diamond containing coatings or components of the present invention, it is preferred to obtain an ultrahard, erosion resistant surface. Such coating or component is desirably free of materials that react with processing chamber gases and are chemically inert such that there is low or no particle contamination, little or no corrosion, little or no metal contamination and/or little or no volatile etch products.

It is preferred that diamond containing coating or component be placed in the regions that may or may not be exposed to the plasma environment such as parts in direct contact with the plasma or parts behind chamber components such as liners, etc., to prevent metal contamination of the semiconductor substrates processed in the reactor chamber. It is particularly preferred to limit or exclude transition metal dust; e.g., any one or more of elements 21 through 29 (scandium through copper), 39 through 47 (yttrium through silver), 57 through 79 (lanthanum through gold) and all known elements from 89 (actinium) on in the Periodic Table. Thereby, according to one advantage of the present invention, unsatisfactory etching or undesirable formation of pinholes in deposited films is reduced by suppressing occurrence of such dust by either erosion or corrosion.

While the invention has been described in detail with reference to specific embodiments thereof, it will be apparent to those skilled in the art that various changes and modifications can be made, and equivalents employed, without departing from the scope of the appended claims.

What is claimed is:

1. A component of semiconductor processing equipment comprising a diamond containing material exposed to plasma in the equipment, the diamond containing material comprising diamond or a diamond-like material and from about 20 to about 80 wt. % of at least one additional material.

2. A component of semiconductor processing equipment comprising a diamond containing material exposed to plasma in the equipment, the diamond containing material having a thickness of at least 0.004 inches.

3. The component according to claim 2, wherein the diamond containing material is disposed on a surface which is a metal, ceramic or polymer surface.

4. The component according to claim 3, wherein said surface is anodized aluminum.

5. The component according to claim 2, wherein a first intermediate coating is on the surface.

6. The component according to claim 2, wherein said component comprises a chamber wall of a plasma etching chamber.

7. The component according to claim 2, wherein said diamond containing material comprises an amorphous tetrahedral carbon.

8. The component according to claim 2, wherein said diamond containing material comprises at least one material other than diamond or a diamond-like material.

9. The component according to claim 8, wherein said other material is a refractory metal or polymer.

10. The component according to claim 9, wherein said other material includes titanium or silicon.

11. The component according to claim 10, wherein said other material comprises titanium carbide, titanium boride, titanium nitride, silicon carbide, silicon boride, silicon nitride or mixtures thereof.

12. The component according to claim 2, wherein said diamond containing material is doped with at least one other material.

13. The component according to claim 8, wherein said diamond containing material is in the form of a composite of a diamond or diamond-like material and said at least one material other than diamond or a diamond-like material.

14. The component according to claim 2, further comprising one or more additional diamond containing or intermediate coatings.

15. The component according to claim 2, wherein diamond or a diamond-like material forms a continuous matrix phase of said diamond containing material.

16. The component according to claim 2, wherein said entire component is made of said diamond containing material.

17. A process of coating a surface of a component of semiconductor processing equipment, the processing comprising:
   (a) optionally depositing a first intermediate coating on a surface of a component of semiconductor processing equipment;
   (b) optionally depositing a second intermediate coating on said first intermediate layer or on said surface; and
   (c) depositing a diamond containing material on said component to form an outer corrosion resistant surface, the diamond containing material having a thickness of at least 0.004 inches and being exposed to plasma in the equipment.

18. The coating process according to claim 1, wherein said surface of said component comprises a metal, ceramic or polymer surface.

19. The coating process according to claim 18, wherein said surface is anodized aluminum.

20. The coating process according to claim 1, wherein said first intermediate coating is not optional.

21. The coating process according to claim 20, wherein said first intermediate coating comprises a metal, ceramic or polymer coating.

22. The coating process according to claim 1, wherein said component comprises a chamber wall of a plasma etching chamber.

23. The coating process according to claim 1, further comprising forming a roughened surface on said component, said diamond containing material being deposited on said roughened surface.

24. The coating process according to claim 1, wherein said diamond containing material comprises an amorphous tetrahedral carbon.

25. The coating process according to claim 1, wherein said diamond containing material comprises at least one material other than diamond or a diamond-like material.

26. The coating process according to claim 25, wherein said other material is a refractory metal or polymer.

27. The coating process according to claim 26, wherein said other material includes titanium or silicon.

28. The coating process according to claim 27, wherein said other material comprises titanium carbide, titanium boride, titanium nitride, silicon carbide, silicon boride, silicon nitride or mixtures thereof.

29. The coating process according to claim 25, wherein said diamond containing material is doped with said at least one other material.

30. The coating process according to claim 25, wherein said diamond containing material is in the form of a composite of a diamond or diamond-like material and said other material.

31. The coating process according to claim 1, wherein said diamond containing material is deposited by chemical vapor deposition, plasma spray coating, sublimation, laser vaporization, sputtering, sputtering deposition, ion beam coating, spray coating, dip coating, evaporation coating, roll-on coating or brush coating.

* * * * *

UNITED STATES PATENT AND TRADEMARK OFFICE
CERTIFICATE OF CORRECTION

PATENT NO.     : 6,537,429 B2
DATED          : March 25, 2003
INVENTOR(S)    : Robert J. O'Donnell et al.

It is certified that error appears in the above-identified patent and that said Letters Patent is hereby corrected as shown below:

Column 8,
Line 65, delete "1" and insert therefor -- 17 --.

Column 9,
Lines 3, 8, 11, 15 and 18, delete "1" and insert therefor -- 17 --.

Column 10,
Line 15, delete "1" and insert therefor -- 17 --.

Signed and Sealed this

Seventh Day of October, 2003

JAMES E. ROGAN
*Director of the United States Patent and Trademark Office*